United States Patent
Newman et al.

(10) Patent No.: US 12,159,796 B2
(45) Date of Patent: *Dec. 3, 2024

(54) SYSTEMS AND METHODS FOR INTEGRATING LOAD LOCKS INTO A FACTORY INTERFACE FOOTPRINT SPACE

(71) Applicant: Applied Materials, Inc., Santa Clara, CA (US)

(72) Inventors: Jacob Newman, Palo Alto, CA (US); Andrew J. Constant, Cupertino, CA (US); Michael R. Rice, Pleasanton, CA (US); Paul B. Reuter, Austin, TX (US); Shay Assaf, Santa Clara, CA (US); Sushant S. Koshti, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/107,701

(22) Filed: Feb. 9, 2023

(65) Prior Publication Data

US 2023/0187239 A1  Jun. 15, 2023

Related U.S. Application Data

(63) Continuation of application No. 17/392,392, filed on Aug. 3, 2021, now Pat. No. 11,581,203.
(Continued)

(51) Int. Cl.
*H01L 21/67* (2006.01)
*B65G 47/90* (2006.01)
*H01L 21/677* (2006.01)

(52) U.S. Cl.
CPC ........ *H01L 21/67201* (2013.01); *B65G 47/90* (2013.01); *H01L 21/67727* (2013.01)

(58) Field of Classification Search
CPC .................... H01L 21/67201; H01L 21/67727
See application file for complete search history.

(56) References Cited

U.S. PATENT DOCUMENTS 5,376,212 A * 12/1994 Saiki ................. H01L 21/67745
414/217
6,034,000 A * 3/2000 Heyder ............. H01L 21/67781
438/758
(Continued)

FOREIGN PATENT DOCUMENTS

JP      H0927536 A      1/1997
JP    2003045933 A      2/2003
(Continued)

OTHER PUBLICATIONS

PCT Notification of Transmittal of the International Search Report and the Written Opinion of the International Searching Authority for PCT Application No. PCT/US2021/048681, mailed Dec. 1, 2021, 11 pages.

(Continued)

*Primary Examiner* — Gerald McClain
(74) *Attorney, Agent, or Firm* — Lowenstein Sandler LLP

(57) ABSTRACT

Devices, systems, and methods for integrating load locks into a factory interface footprint space. A factory interface for an electronic device manufacturing system can include an interior volume defined by a bottom, a top and a plurality of sides, a load lock disposed within the interior volume of the factory interface, and a factory interface robot disposed within the interior volume of the factory interface, wherein the factory interface robot is configured to transfer substrates between a set of substrate carriers and the load lock.

22 Claims, 10 Drawing Sheets

Related U.S. Application Data

(60) Provisional application No. 63/073,715, filed on Sep. 2, 2020.

(56) References Cited

U.S. PATENT DOCUMENTS

| | | | |
|---|---|---|---|
| 6,082,951 | A | 7/2000 | Nering et al. |
| 6,270,306 | B1 | 8/2001 | Otwell et al. |
| 6,486,444 | B1 | 11/2002 | Fairbairn |
| 6,647,665 | B1 | 11/2003 | Tabrizi |
| 7,010,388 | B2 | 3/2006 | Mitchell |
| 7,419,346 | B2 | 9/2008 | Danna et al. |
| 7,699,574 | B2 | 4/2010 | Ferrara |
| 7,942,619 | B2 | 5/2011 | Hashimoto et al. |
| 7,949,425 | B2 | 5/2011 | Mitchell |
| 9,312,153 | B2 * | 4/2016 | Hiroki ............... H01L 21/67161 |
| 11,581,203 | B2 * | 2/2023 | Newman ........... H01L 21/67727 |
| 11,688,619 | B2 * | 6/2023 | Wakabayashi .... H01L 21/67196 414/805 |
| 11,862,506 | B2 * | 1/2024 | Amikura ........... H01L 21/67201 |
| 2002/0094696 | A1 | 7/2002 | Heyder et al. |
| 2004/0234359 | A1 | 11/2004 | Mitchell |
| 2006/0151735 | A1 * | 7/2006 | Lee ....................... F16K 1/2021 251/195 |
| 2007/0243049 | A1 | 10/2007 | Ferrara |
| 2008/0093022 | A1 | 4/2008 | Yilmaz et al. |
| 2010/0111648 | A1 | 5/2010 | Tamura et al. |
| 2010/0190343 | A1 * | 7/2010 | Aggarwal ............. C30B 25/025 269/37 |
| 2013/0115028 | A1 | 5/2013 | Kremerman et al. |
| 2014/0271054 | A1 | 9/2014 | Weaver |
| 2014/0363258 | A1 | 12/2014 | Iwamoto et al. |
| 2016/0284578 | A1 | 9/2016 | Weaver et al. |
| 2017/0067163 | A1 | 3/2017 | Papasouliotis et al. |
| 2018/0068881 | A1 * | 3/2018 | Cavins .............. H01L 21/67766 |
| 2018/0151403 | A1 | 5/2018 | Smith |
| 2018/0286716 | A1 * | 10/2018 | Sakata .............. H01L 21/68707 |
| 2019/0355600 | A1 | 11/2019 | Rice |
| 2019/0362995 | A1 | 11/2019 | Ito et al. |
| 2020/0219744 | A1 | 7/2020 | Kim et al. |
| 2020/0312691 | A1 | 10/2020 | Kagami et al. |
| 2022/0044952 | A1 * | 2/2022 | Wakabayashi ...... C23C 16/4401 |

FOREIGN PATENT DOCUMENTS

| | | |
|---|---|---|
| JP | 4389424 B2 | 12/2009 |
| JP | 2010135495 A | 6/2010 |
| JP | 4712379 B2 | 6/2011 |
| JP | 2017108048 A | 6/2017 |
| JP | 2019161119 A | 9/2019 |
| KR | 20140133534 A | 11/2014 |

OTHER PUBLICATIONS

International Preliminary Report on Patentability for International Application No. PCT/US2021/048681, mailed Mar. 16, 2023, 7 Pages.

International Search Report and Written Opinion for International Application No. PCT/US2022/018768, mailed Jun. 21, 2022, 12 Pages.

International Search Report and Written Opinion for International Application No. PCT/US2022/046317, mailed Feb. 9, 2023, 11 Pages.

* cited by examiner

SYSTEMS AND METHODS FOR INTEGRATING LOAD LOCKS INTO A FACTORY INTERFACE FOOTPRINT SPACE

RELATED APPLICATION

This application a continuation of U.S. patent application Ser. No. 17/392,392, filed Aug. 3, 2021, issued as U.S. Pat. No. 11,581,203 on Feb. 14, 2023, which claims the benefit of U.S. Provisional Application No. 63/073,715, filed Sep. 2, 2020, the entire contents of both are hereby incorporated by reference herein.

TECHNICAL FIELD

Embodiments of the present disclosure relate, in general, to systems and methods for integrating load locks into a factory interface footprint space.

BACKGROUND

An electronic device manufacturing system can include one or more tools or components for transporting and manufacturing substrates. Such tools or components can include a factory interface connected to a load lock and/or transfer chamber. In some instances, the load lock is positioned between the transfer chamber and the factory interface. However, such a configuration can be inefficient due to the manufacturing system using a large operational footprint. For example, this configuration can have a long width and/or length and large sections of unused space. Accordingly, improved electronic device manufacturing systems, apparatus, and methods for transporting and manufacturing substrates with increased footprint efficiency are sought.

SUMMARY

Some of the embodiments described cover a factory interface for an electronic device manufacturing system. The factory interface includes an interior volume defined by a bottom, a top, and a plurality of sides. The factory interface further includes a first load lock disposed within the interior volume of the factory interface. A first factory interface robot is disposed within the interior volume of the factory interface. The first factory interface robot is configured to transfer substrates between a first set of substrate carriers and the first load lock.

In some embodiments, an electronic device manufacturing system includes a transfer chamber and a plurality of processing chambers connected to the transfer chamber. The electronic device manufacturing system further includes a first load lock having a first side and a second side that is approximately perpendicular to the first side of the first load lock. The first side of the first load lock is connected to the transfer chamber. The electronic device manufacturing system further includes a second load lock having a first side and a second side that is approximately perpendicular to the first side of the second load lock. The first side of the second load lock is connected to the transfer chamber. A first factory interface is connected to the second side of the first load lock and a second factory interface is connected to the second side of the second load lock.

In some embodiments, a method for transporting substrates from a first factory interface robot to a second factory interface robot includes retrieving, by a first factory interface robot, a substrate from a substrate carrier. The method further includes transferring the substrate from the first factory interface robot to a second factory interface robot. The first factory interface robot and the second factory interface robot are disposed within a factory interface. The method further includes placing the substrate, via the second factory interface robot, inside a load lock disposed within the factory interface.

BRIEF DESCRIPTION OF THE DRAWINGS

The present disclosure is illustrated by way of example, and not by way of limitation, in the figures of the accompanying drawings in which like references indicate similar elements. It should be noted that different references to "an" or "one" embodiment in this disclosure are not necessarily to the same embodiment, and such references mean at least one.

DETAILED DESCRIPTION OF EMBODIMENTS

Figure 1A:
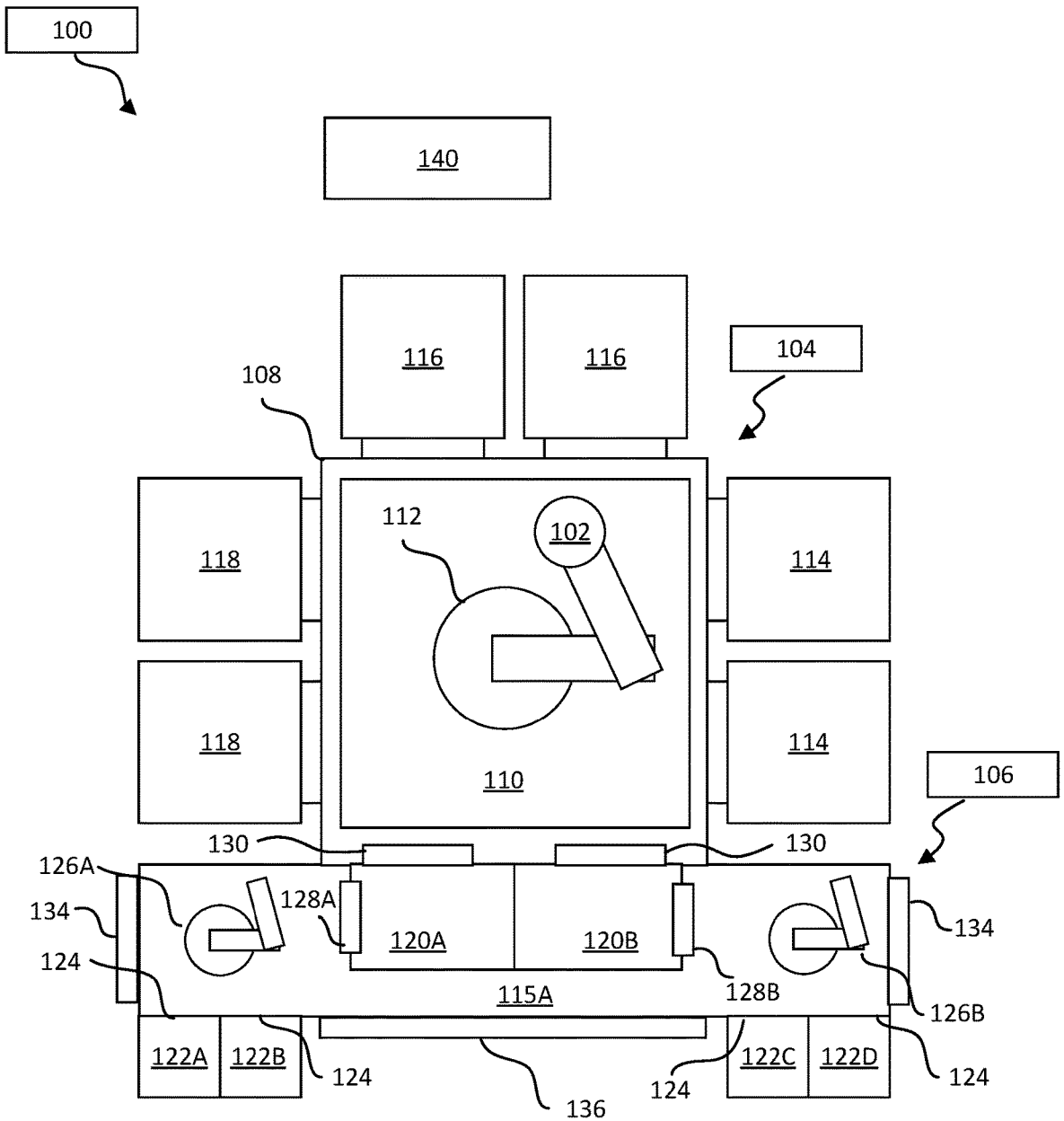
FIG. 1A is a top schematic view of an example electronic device manufacturing system, according to aspects of the present disclosure.

Embodiments described herein are related to systems and methods for integrating load locks into a factory interface footprint space. Embodiments cover multiple different designs for factory interfaces and load locks that reduce a total footprint of electronic device manufacturing systems. In some embodiments, load locks are integrated into the interior of a factory interface, thus reducing the floor space traditionally dedicated for load locks. In some embodiments, a factory interface is split into two smaller factory interfaces (e.g., a left and right factory interface) with one or more load locks positioned between the two smaller factory interfaces. In such a configuration, the total footprint of the combined space of the load locks plus the factory interfaces is reduced as compared to a traditional load lock and factory interface configuration. Floor space in fabrication facilities (fabs) for electronic devices is very costly, and any reduction in the footprint of electronic device manufacturing systems can reduce the cost of ownership of those electronic device manufacturing systems. Reducing the footprint of the systems also allows the owner to fit more systems into the limited fab space, which in turn allows the processing of more wafers. Thus, embodiments described herein provide factory interfaces and load locks that reduce the footprint and overall cost of ownership of electronic device manufacturing systems.

In embodiments, a factory interface for an electronic device manufacturing system is connected to a transfer chamber. The factory interface has an interior volume defined by a bottom, a top, and a plurality of sides. A first load lock and a second load lock are disposed within the interior volume of the factory interface. A first factory interface robot and a second factory interface robot can also be disposed within the interior volume of the factory interface. The first factory interface robot can be configured to transfer substrates between a first set of substrate carriers and the first load lock, and the second factory interface robot can be configured to transfer substrates between a second set of substrate carries and the second load lock.

In some embodiments, the plurality of sides include a back side that is configured to face the transfer chamber of the electronic device manufacturing system, a front side, a right side and a left side. The first factory interface robot can be disposed within the interior volume proximate to the left side, and the second factory interface robot can be disposed within the interior volume proximate to the right side. The first load lock and the second load lock are disposed adjacent to the back side and between the first factory interface robot and the second factory interface robot such that the first load lock is nearer to the first factory interface robot than the second load lock and the second load lock is nearer to the second factory interface robot than the first load lock.

In some embodiments, the factory interface includes a first set of load ports for receiving the first set of substrate carriers and a second set of load ports for receiving the second set of substrate carriers. The first set of load ports can be positioned at a first portion of the front side that is proximate to the left side. The second set of load ports can be positioned at a second portion of the front side that is proximate to the right side.

In some embodiments, the factory interface includes a via disposed within the interior volume of the factory interface above or below the first load lock and/or a second load lock. In embodiments, the via is at equal reach from the first factory interface robot and the second factory interface robot (e.g., may be positioned at a centerline of the combined first and second load lock bodies). In embodiments, the via is offset from a center of the factory interface such that it is closer to the first factory interface robot or closer to the second factory interface robot. The first factory interface robot can be configured to transfer a substrate to the second factory interface robot through the via.

In some embodiments, the sides of the factory interface can include a back side that is configured to face a transfer chamber of the electronic device manufacturing system, a right side, and a left side The first factory interface robot can be disposed within the interior volume proximate to the left side, and the first load lock can be disposed adjacent to the back side and between the first factory interface robot and the right side. Further, the second factory interface robot can be disposed within the interior volume proximate to the right side, and the second load lock can be disposed adjacent to the back side and between the second factory interface robot and the left side.

In some embodiments, the first load lock can include a first door that is approximately perpendicular to the back side and accessible by the first factory interface robot. The first load lock can further include a second door that is approximately parallel to the back side and accessible by a transfer chamber robot. The second load lock can include a third door that is approximately perpendicular to the back side and accessible by the second factory interface robot. The second load lock can further include a fourth door that is approximately parallel to the back side and accessible by a transfer chamber robot. In some embodiments, the first load lock and the second load lock can include a batch load lock. In some embodiments, a further load lock disposed within the interior volume of the factory interface and below the first load lock.

In some embodiments, the sides of the factory interface can include a back side that is configured to face a transfer chamber of the electronic device manufacturing system, a front side, a right side, and a left side. The front side can include a center portion, a left front portion, and a right front portion. The center portion can protrude away from the left front portion, the right front portion, and the back side, where a first load port for receiving a first substrate carrier from the first set of substrate carriers is positioned at a first position on the front left portion, and a second load port for receiving a second substrate carrier from the first set of substrate carries is positioned at a second position on the right front portion.

By providing a system that integrates the load locks and the factory interface into a single volume, the electronic device manufacturing system is provided with an increased foot print efficiency. Specifically, prior electronic device manufacturing system designs position the load lock(s) between the transfer chamber and the factory interface, which give the manufacturing system a long profile. In some embodiments of the present disclosure, the load locks and the factory interface are integrated into a single volume, where one or more factory interface robots are disposed within the volume and to the sides of the load locks. Thus, the manufacturing system has a decreased depth of, for example, two and a half feet. Accordingly, this allows for additional throughput per square meter of the volume, which can improve overall system yield and/or cost.

Figure 1B:
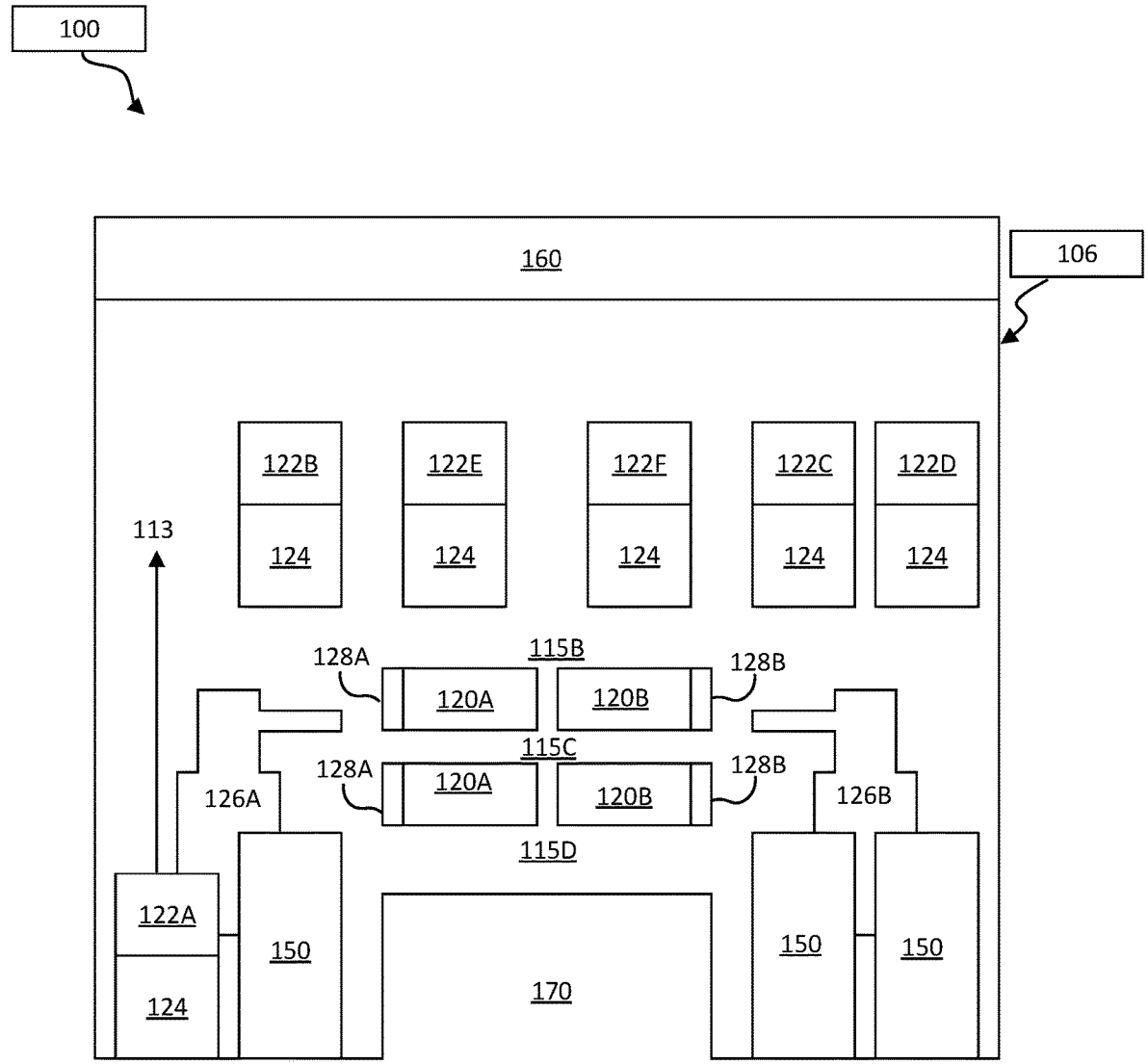
FIG. 1B is a front schematic view of an example electronic device manufacturing system, according to aspects of the present disclosure.
Figure 1C:
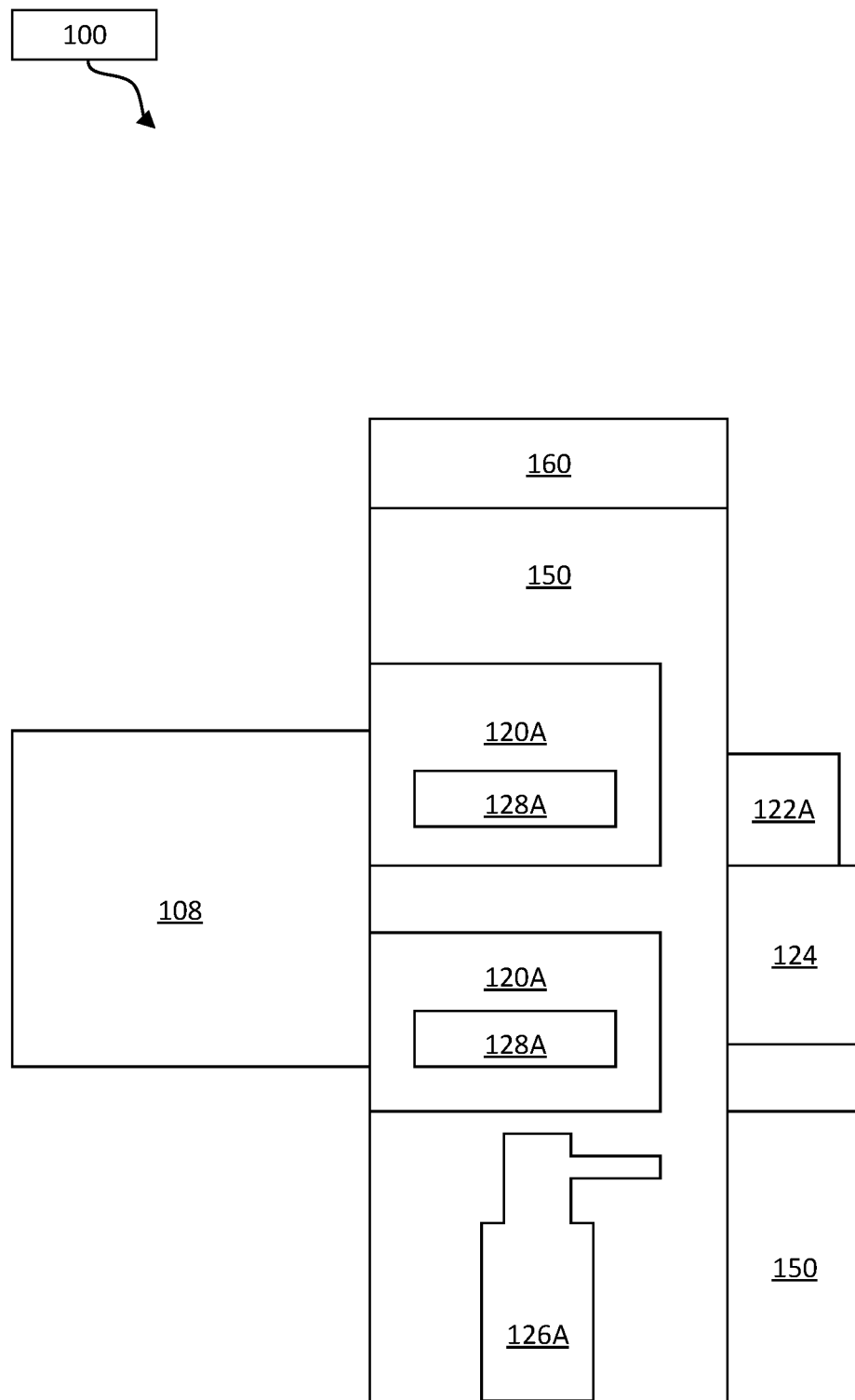
FIG. 1C is a side schematic views of example electronic device manufacturing system, according to aspects of the present disclosure.
Figure 1D:
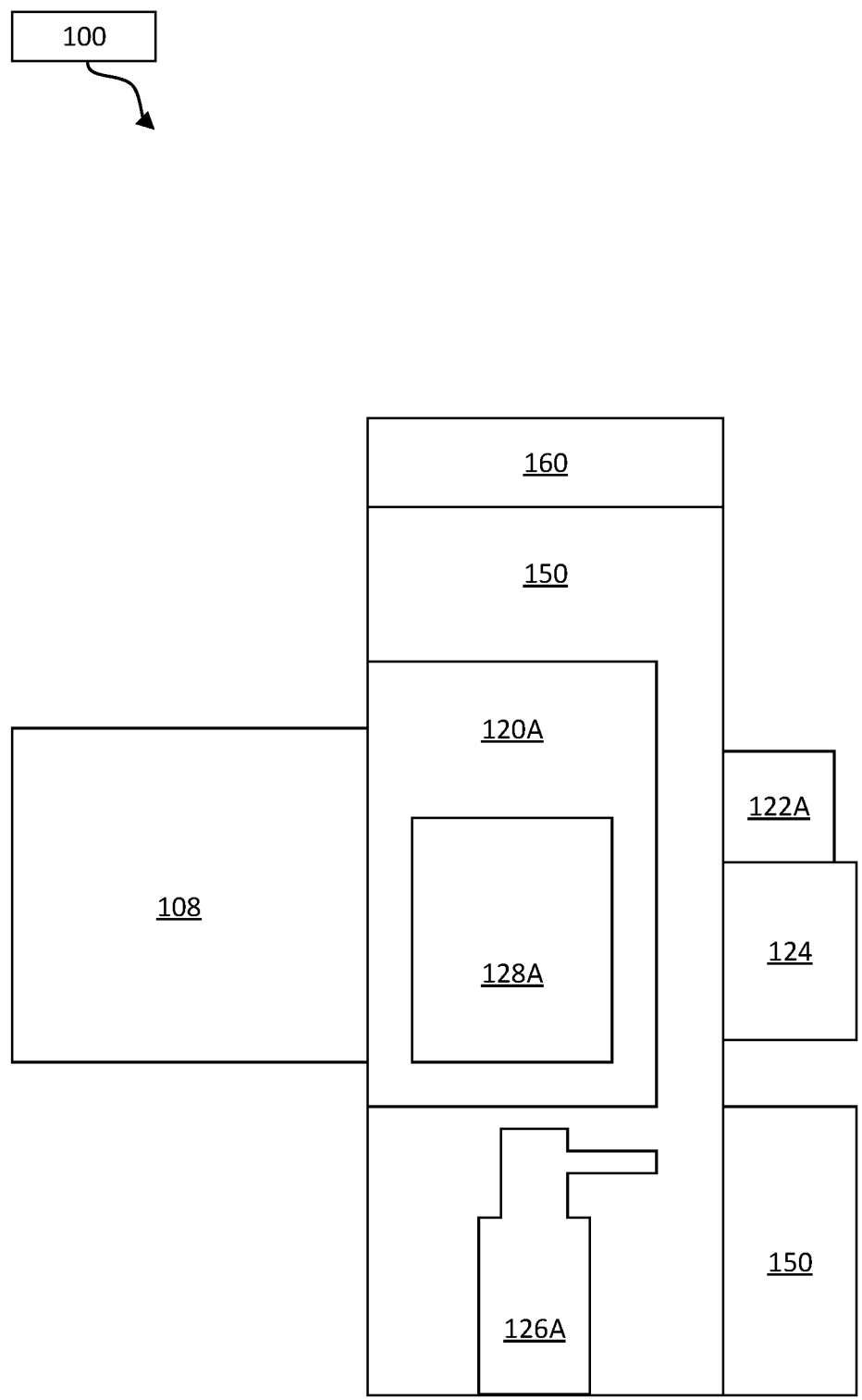
FIG. 1D is another side schematic views of example electronic device manufacturing system, according to aspects of the present disclosure

FIGS. 1A-1D describe an electronic device manufacturing system 100 where one or more load locks 120A-B are integrated into the volume of a factory interface 106. FIG. 1A is a top schematic view of the example electronic device manufacturing system 100, according to aspects of the present disclosure. FIG. 1B is a front schematic view of the example electronic device manufacturing system 100, according to aspects of the present disclosure. FIGS. 1C and 1D are side schematic views of the example electronic device manufacturing system 100, according to aspects of the present disclosure. It is noted that FIGS. 1A-1D are used for illustrative purposes, and that different component may be positioned in different location in relation to each view.

Electronic device manufacturing system 100 (also referred to as an electronics processing system) is configured to perform one or more processes on a substrate 102. Substrate 102 can be any suitably rigid, fixed-dimension, planar article, such as, e.g., a silicon-containing disc or wafer, a patterned wafer, a glass plate, or the like, suitable for fabricating electronic devices or circuit components thereon.

Electronic device manufacturing system 100 includes a process tool (e.g., a mainframe) 104 and a factory interface 106 coupled to process tool 104. Process tool 104 includes a housing 108 having a transfer chamber 110 therein. Transfer chamber 110 includes one or more processing chambers (also referred to as process chambers) 114, 116, 118 disposed therearound and coupled thereto. Processing chambers 114, 116, 118 can be coupled to transfer chamber 110 through respective ports, such as slit valves or the like.

Processing chambers 114, 116, 118 can be adapted to carry out any number of processes on substrates 102. A same or different substrate process can take place in each processing chamber 114, 116, 118. Examples of substrate processes include atomic layer deposition (ALD), physical vapor deposition (PVD), chemical vapor deposition (CVD), etching, annealing, curing, pre-cleaning, metal or metal oxide removal, or the like. In one example, a PVD process is performed in one or both of process chambers 114, an etching process is performed in one or both of process chambers 116, and an annealing process is performed in one or both of process chambers 118. Other processes can be carried out on substrates therein. Processing chambers 114, 116, 118 can each include a substrate support assembly. The substrate support assembly can be configured to hold a substrate in place while a substrate process is performed.

Transfer chamber 110 also includes a transfer chamber robot 112. Transfer chamber robot 112 can include one or multiple arms where each arm includes one or more end effectors at the end of each arm. The end effector can be configured to handle particular objects, such as wafers. Alternatively, or additionally, the end effector is configured to handle objects such as process kit rings. In some embodiments, transfer chamber robot 112 is a selective compliance assembly robot arm (SCARA) robot, such as a 2 link SCARA robot, a 3 link SCARA robot, a 4 link SCARA robot, and so on.

Load locks 120A-B can be coupled to housing 108 and transfer chamber 110. Load locks 120A-B can be disposed within an interior volume of factory interface 106 and can be configured to interface with transfer chamber 110 and factory interface 106. Load locks 120A-B can have an environmentally-controlled atmosphere that is changed from a vacuum environment (where substrates are transferred to and from transfer chamber 110) to an at or near atmospheric-pressure inert-gas environment (where substrates are transferred to and from an interior volume of factory interface 106 that is external to the load locks) in some embodiments. In some embodiments, as shown in FIGS. 1B and 1C, load locks 120A-B are each a stacked load lock having one or more (e.g., a pair) of upper interior chambers and one or more (e.g., a pair) of lower interior chambers that are located at different vertical levels (e.g., one above another). In some embodiments, the one or more upper interior chambers are configured to receive processed substrates from transfer chamber 110 for removal from process tool 104, while the one or more lower interior chambers are configured to receive substrates from factory interface 106 for processing in process tool 104, or vice versa. In some embodiments, as shown in FIG. 1D, load locks 120A-B are each a batch load lock, which may be configured to hold and/or transfer multiple substrates (e.g., 25 substrates). In some embodiments, load locks 120A-B are configured to perform a substrate process (e.g., an etch or a pre-clean) on one or more substrates 102 received therein. Accordingly, load locks 120A-B may include one or more heating elements for heating the substrates and/or cooling elements for cooling the substrates.

Factory interface 106 can be any suitable enclosure, such as, e.g., an Equipment Front End Module (EFEM). Factory interface 106 can be configured to receive substrates 102 from substrate carriers 122A-F (e.g., Front Opening Unified Pods (FOUPs)) docked at various load ports 124 of factory interface 106. In a first example, as shown in FIG. 1A, factory interface 106 can include four load ports 124, which may be positioned at a front side of the factory interface 106 at one or more elevations. In a second example, as shown in FIG. 1B, factory interface 106 can include six load ports 124, which may be positioned at a front side of the factory interface 106 at one or more elevations. Factory interface 106 can be configured with any number of load ports 124, which may be located at one or more sides of the factory interface 106 and at the same or different elevations.

As shown in FIG. 1B, load ports 124 can be located at different elevations along the walls of factory interface 106. Elevating the load ports 124 allows for placement of one or more auxiliary components 150 at the base of factory interface 106. Auxiliary components 150 will be explained in more detail below. In some embodiments, as shown in FIG. 1B, one or more load ports 124 can be located at or near the factory interface base on the front side of factory interface 106, while one or more further load ports 124 can be located at a higher elevation (e.g., approximately two meters from the ground). In some embodiments, one or more substrate carrier elevator 113 can be configured to raise a substrate carrier 122A-F. In some embodiments, the substrate carrier elevator 113 can raise one or more substrate carriers 122A-F to an overhead automation component (not shown). The overhead automation component can deliver the one or more substrate carriers 122A-F to one or more an elevated load ports 124. Further, the overhead automation component can remove the one or more substrate carriers 112A-F from the one or more elevated load ports 124. In an example, a factory operator can load a substrate carrier 122A-F onto the substrate carrier elevator 113, engage the elevator to raise the substrate carrier 122A-F to the overhead automation component, engage the overhead automation component to deliver the substrate carrier 122A-F to a load port 124, then engage the overhead automation component to remove the substrate carrier 122A-F from the load port once empty, and engage the elevator to lower the substrate carrier 122A-F.

In some embodiments, at least one load port 124 may be positioned at a lower elevation that is accessible to factory operators who can manually load one or more substrate carriers 112A-F to said load port 124. One or more further load ports 124 may be positioned at a higher elevation, whereby the factory operators can engage the substrate carrier elevator 113 and the overhead automation component to load the one or more substrate carriers 112A-F to the elevated load ports 124. Such a configuration can allow for additional space at the base of the front side of the factory interface, whereby component placed in that space would not increase the operational footprint of the electronic device manufacturing system 100. For example, in some embodiments, auxiliary components 150 can be replaced with load ports 124. For example, four or six load ports 124 can be located at or near the factory interface base on the front side of factory interface 106. In some other embodiments, one or more load ports 124 can be loaded on a side wall of factory interface 106.

Factory interface robots 126A-B can be configured to transfer substrates 102 between substrate carriers (also referred to as containers) 122A-F and load locks 120A-B. In one embodiment, factory interface 106 includes two or more factory interface robots. For example, factory interface 106 may include a first factory interface robot 126A disposed within the factory interface at a first side (e.g., left-hand side) of the factory interface 106 and a second factory interface robot 126B disposed within the factory interface at a second side (e.g., right-hand side) of the factory interface 106. In one embodiment, the first and second load locks 120A, 120B are disposed within the factory interface 106 between the first and second factory interface robots 126A, 126B, with load lock 120A being closer to factory interface robot 126A and load lock 120B being closer to factory interface robot 126B.

In an example, factory interface robot 126A can be configured to transfer substrates 102 between a first set of substrate carriers (e.g., substrate carriers 122A-B, 122E) and load lock 120A. In another example, factory interface robot 126B can be configured to transfer substrates 102 between a second set of substrate carriers (e.g., substrate carriers 122C-D, 122-F) and load lock 120B. However, it is noted that factory interface robots 126A-B can be configured to transfer substrates 102 between any of the substrate carriers 122A-F and load locks 120A-B. In other and/or similar embodiments, factory interface 106 is configured to receive replacement parts from replacement parts storage containers, and factory interface robots 126A-B are configured to transport such replacement parts into and out of one or more of the load locks 120A-B. In some embodiments, factory interface robot 126A cannot access load lock 120B and factory interface robot 128B cannot access load lock 120A.

Factory interface robots 126A-B can include one or more robot arms and can each be or include a SCARA robot. In some embodiments, factory interface robots 126A-B has more links and/or more degrees of freedom than transfer chamber robot 112. Each of the factory interface robots 126A-B may include actuators that can adjust a height of one or more of the robot arms of the respective factory interface robots 126A-B, enabling the factory interface robots 126A-B to reach carriers connected to load ports at different elevations. Factory interface robots 126A-B can each include an end effector on an end of each robot arm. The end effector can be configured to pick up and handle specific objects, such as wafers. Alternatively, or additionally, the end effector can be configured to handle objects such as process kit rings. Any conventional robot type can be used for factory interface robots 126A-B. Transfers can be carried out in any order or direction.

Factory interface 106 can be maintained in, e.g., a slightly positive-pressure non-reactive gas environment (using, e.g., nitrogen as the non-reactive gas) in some embodiments. In embodiments, factory interface 106 includes an environmental control system with one or more inert gas delivery line, one or more exhaust line, and one or more sensors usable to measure one or more of humidity, O2 level, temperature, pressure, gas flow rates, and/or other parameters. The environmental control system may adjust the gases and/or rates of gases flowed into the factory interface and/or the rates of gases exhausted from the factory interface based on the one or more measured parameters. In embodiments, the factory interface further includes a recirculation system that may filter gases exhausted from the factory interface and recirculate the filtered gasses back into the interior of the factory interface.

Each of load locks 120A-B can include one or more slit valves and/or doors configured to open when receiving or releasing substrates to and/or from factory interface robots 126A-B and transfer chamber robot 112. The slit valves and/or doors may be used to maintain a vacuum environment, a clean environment, and/or a temperature controlled environment. For example, the slit valves and/or doors may be used to maintain a vacuum environment within the transfer chamber 110 and an inert gas environment within factory interface 106. Load lock 120A can include one (as shown in FIG. 1D) or multiple (as shown in FIG. 1C) side doors 128A which can grant access to factory interface robot 126A. Load lock 120B can include one or more side doors 128B which can grant access to factory interface robot 126B. Load locks 120A-B can include one or more front doors (not shown) which grant access to transfer chamber robot 112.

As shown, in one embodiment side door 128A is approximately perpendicular to a back side of factory interface 106, and is also approximately perpendicular to door 130. Similarly, in one embodiment side door 128B is approximately perpendicular to the back side of factory interface 106, and is also approximately perpendicular to door 130. Side door 128A may face an opposite direction to side door 128B. Though not shown, one or more additional side doors may be included in load locks 120A, 120B, where the one or more additional side doors are between and separate the load locks 120A-B. For example, an additional side door of load lock 120B may be on an opposite side of side door 128B, and may be opened to permit factory interface robot 126B to place substrates in load lock 120A, to permit factory interface robot 126A to place substrates in load lock 120B, and/or to permit handoff of substrates between factory interface robot 126A and factory interface robot 126B.

In embodiments, factory interface robots 126A-B may orient end effectors in a first direction that is pointed towards and approximately perpendicular to a front side of the factory interface when retrieving substrates from and/or placing substrates in containers 122A-F. In embodiments, factory interface robot 126A may orient one or more end effectors in a second direction that may be approximately perpendicular to the first direction when retrieving substrates from and/or placing substrates in load lock 120A. Similarly, factory interface robot 126B may orient one or more end effectors in a third direction that may be approximately perpendicular to the first direction when retrieving substrates from and/or placing substrates in load lock 120B. Third direction may be approximately 180 degrees from the second direction in embodiments.

In some embodiments, transfer chamber 110, process chambers 114, 116, and 118, and/or load locks 120A-B are maintained at a vacuum level. Electronic device manufacturing system 100 can include one or more vacuum ports that are coupled to one or more stations of electronic device manufacturing system 100. For example, vacuum ports 130 can be coupled to load locks 120A-B and disposed between load locks 120A-B and transfer chamber 110. In some embodiments, additional vacuum ports can be used. For example, further vacuum ports (not shown) can couple factory interface 106 to load locks 120A-B. In some embodiments, a factory operator can access load locks 120A-B for maintenance or repair without shutting down factory interface 106. This will be discussed in further detail below.

In some embodiments, one or more utility lines (not shown) are configured to provide utilities to factory interface 106. The utility lines can include a power utility line configured to provide power to factory interface 106, an air utility line configured to provide air to factory interface 106 (e.g., a clean dry air (CDA) utility line), a vacuum utility line configured to provide a vacuum to vacuum ports 130 and/or to the interior chamber of the factory interface 106, and/or a nitrogen utility line configured to provide nitrogen to factory interface 106.

One of more utility cables can be configured to protect the one or more utility lines. For example, each utility line can be enclosed within a utility cable. Multiple utility lines can be enclosed within the same utility cable and/or utility lines can be included within separate utility cables. A first end of each utility cable can be mounted to an outlet of a utility supply (e.g., a power supply, an air supply, a vacuum pump, a nitrogen supply, etc.). In some embodiments, the outlet of a utility supply is connected to the floor (or a wall) of electronic device manufacturing system 100. As such, the first end of each utility cable can be mounted to the ground of the fab (e.g., the ground over which the factory interface 106 is installed). A second end of each utility cable can be mounted to an inlet of factory interface 106. In some embodiments, the inlet is located at a bottom of factory interface 106. As such, the second end of each utility cable is mounted to the bottom of factory interface 106.

Electronic device manufacturing system 100 can also include a system controller 140. System controller 140 can be and/or include a computing device such as a personal computer, a server computer, a programmable logic controller (PLC), a microcontroller, and so on. System controller 140 can include one or more processing devices, which can be general-purpose processing devices such as a microprocessor, central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets or processors implementing a combination of instruction sets. The processing device can also be one or more special-purpose processing devices such as an application specific integrated circuit (ASIC), a field programmable gate array (FPGA), a digital signal processor (DSP), network processor, or the like. System controller 140 can include a data storage device (e.g., one or more disk drives and/or solid state drives), a main memory, a static memory, a network interface, and/or other components. System controller 128 can execute instructions to perform any one or more of the methodologies and/or embodiments described herein. The instructions can be stored on a computer readable storage medium, which can include the main memory, static memory, secondary storage and/or processing device (during execution of the instructions). System controller 140 may include an environmental controller configured to control an environment (e.g., pressure, moisture level, vacuum level, etc.) within factory interface 106. In embodiments, execution of the instructions by system controller 140 causes system controller to perform the methods of one or more of FIG. 4. System controller 140 can also be configured to permit entry and display of data, operating commands, and the like by a human operator.

Referring now to FIGS. 1A-B, in some embodiments, factory interface robot 126A is configured to transfer one or more substrate to factory interface robot 126B, or vice-versa, using a pass through area 115A, 115B, 115C. In a first example, a pass through area 115A can be disposed between a front side of the factory interface and a front-facing side of the load locks, as shown in FIG. 1A. In a second example, a pass through area 115B can be a via or open space disposed within the interior volume of the factory interface 106 above load locks 120A-B. In a third example, a pass through area 115C can be an open space or a via disposed within the interior volume of factory interface 106 between a pair of upper interior chambers and a pair of lower interior chambers of load locks 120A-B (e.g., where load locks 120A-B are each a stacked load lock). In a fourth example, a pass through area 115D can be an open space or a via disposed within the interior volume of the factory interface 106 below load locks 120A-B. Factory interface robot 126A can be configured to transfer one or more substrates to the factory interface robot 126B through one or more of pass through areas 115A-D in embodiments.

In some embodiments, factory interface robot 126A can hand-off the substrate(s) to factory interface robot 126B, and vice versa. In some embodiments, factory interface robot 126A can place the substrate(s) on a shelf in any of the pass through areas 115A-D that are included in the factory interface, and factory interface robot 126B can retrieve the substrate(s) from the shelf.

Referring to FIGS. 1B-D, factory interface 106 can include one or more auxiliary components 150 that are accessible by the factory interface robots and are part of the factory interface mini-environment. The auxiliary components 150 can include substrate wafer storage stations, metrology stations, cooldown stations, servers, etc. A substrate storage container can store substrates and/or substrate carriers (e.g., FOUPs), for example. Metrology equipment can be used to determine property data of the products that were produced by the electronic device manufacturing system 100. In some embodiments, factory interface 106 can include upper compartment 160, as seen in FIG. 1B. Upper compartment 160 can house electronic systems (e.g., servers, air conditioning units, etc.), utility cables, system controller 140, or other components.

Factory interface 106 can include one or more access doors 134, 136, which may be used to inspect or perform maintenance on load locks 120A-B, factory interface robots 126A-B, or other components. In some embodiments, factory interface can include side access doors 134. In some embodiments, factory interface 106 can include front access door 136. Load locks 120A-B can be insulated from the clean environment generated by factory interface 106 by way of side doors 128A-B. This allows the factory operator to access load locks 120A-B without shutting down the clean environment generated by factory interface 106.

In the illustrated embodiments of FIGS. 1A, 1C, 1D, there is an open space (e.g., pass through area 115A) between a front of the factory interface and a front of the load locks 120A-B. In alternative embodiments, the load locks 120A, 120B may extend all the way to the front of the factory interface 106. In such an embodiment, the load locks may be accessed without exposing the interior volume of the factory interface 106 to an external environment. In an embodiment, load locks 120A, 120B include additional access doors (not shown) that are on opposite sides of the load locks to doors 130. Such access doors may be opened while doors 130, 128A, 128B are closed to enable maintenance access to the load locks 120A-B without exposing the interior of the factory interface 106 to an external environment.

In some embodiments, as shown in FIG. 1B, factory interface 106 can include under access area 170. Under access area 170 can be a channel that allows a factory operator to provide maintenance for factory interface 106, load locks 120A-B, factory interface robots 126A-B, transfer chamber 108, and/or other components of the electronic device manufacturing system 100. In some embodiments, in which the factory interface includes under access area 170, load locks 120A, 120B include maintenance access doors on an underside of the load locks 120A, 120B, which are reachable from the under access area 170.

In a descriptive example, factory interface 106 includes a plurality of sides which comprise a back side that is configured to face transfer chamber 110 of the electronic device manufacturing system 100, a front side, a right side and a left side. A first factory interface robot (e.g., factory interface robot 126A) is disposed within the interior volume proximate to the left side, and a second factory interface robot (e.g., factory interface robot 126B) is disposed within the interior volume proximate to the right side. A first load lock (e.g., load lock 120A) and a second load lock (e.g., load lock 120B) are disposed adjacent to the back side and between the first factory interface robot and the second factory interface robot such that the first load lock is nearer to the first factory interface robot than the second load lock and the second load lock is nearer to the second factory interface robot than the first load lock. Factory interface 106 includes a first set of load ports (e.g., one or more of load ports 122) for receiving the first set of substrate carriers (e.g., one or more of substrate carriers 122A-F), where the first set of load ports are positioned at a first portion of the front side that is proximate to the left side. Factory interface 106 also includes a second set of load ports (e.g., one or more of load ports 122) for receiving the second set of substrate carriers (e.g., one or more of substrate carriers 122A-F), where the second set of load ports are positioned at a second portion of the front side that is proximate to the right side. Factory interface 106 can include at least one of a substrate storage container or metrology equipment positioned below a load port 122 of the first set of load ports. The plurality of sides can include a back side that is configured to face transfer chamber 110, a right side and a left side, where the first factory interface robot is disposed within the interior volume proximate to the left side, and the first load lock is disposed adjacent to the back side and between the first factory interface robot and the right side. The first load lock can include a first door (e.g., side door 128A) that is approximately perpendicular to the back side and accessible by the first factory interface robot, and a second door that is approximately parallel to the back side and accessible by transfer chamber robot 112.

Figure 2A:
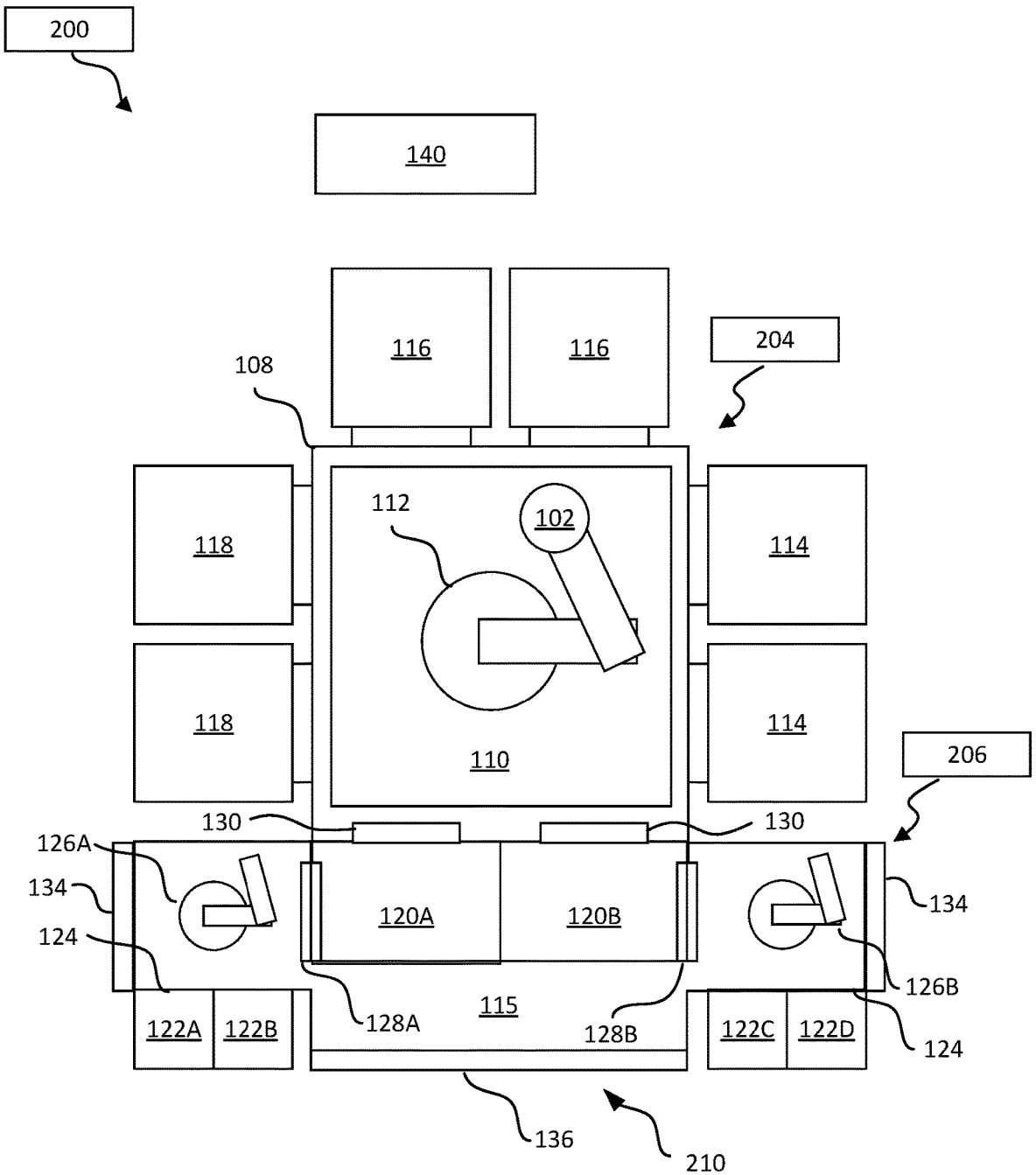
FIG. 2A is a top schematic view of another example electronic device manufacturing system, according to aspects of the present disclosure.
Figure 2B:
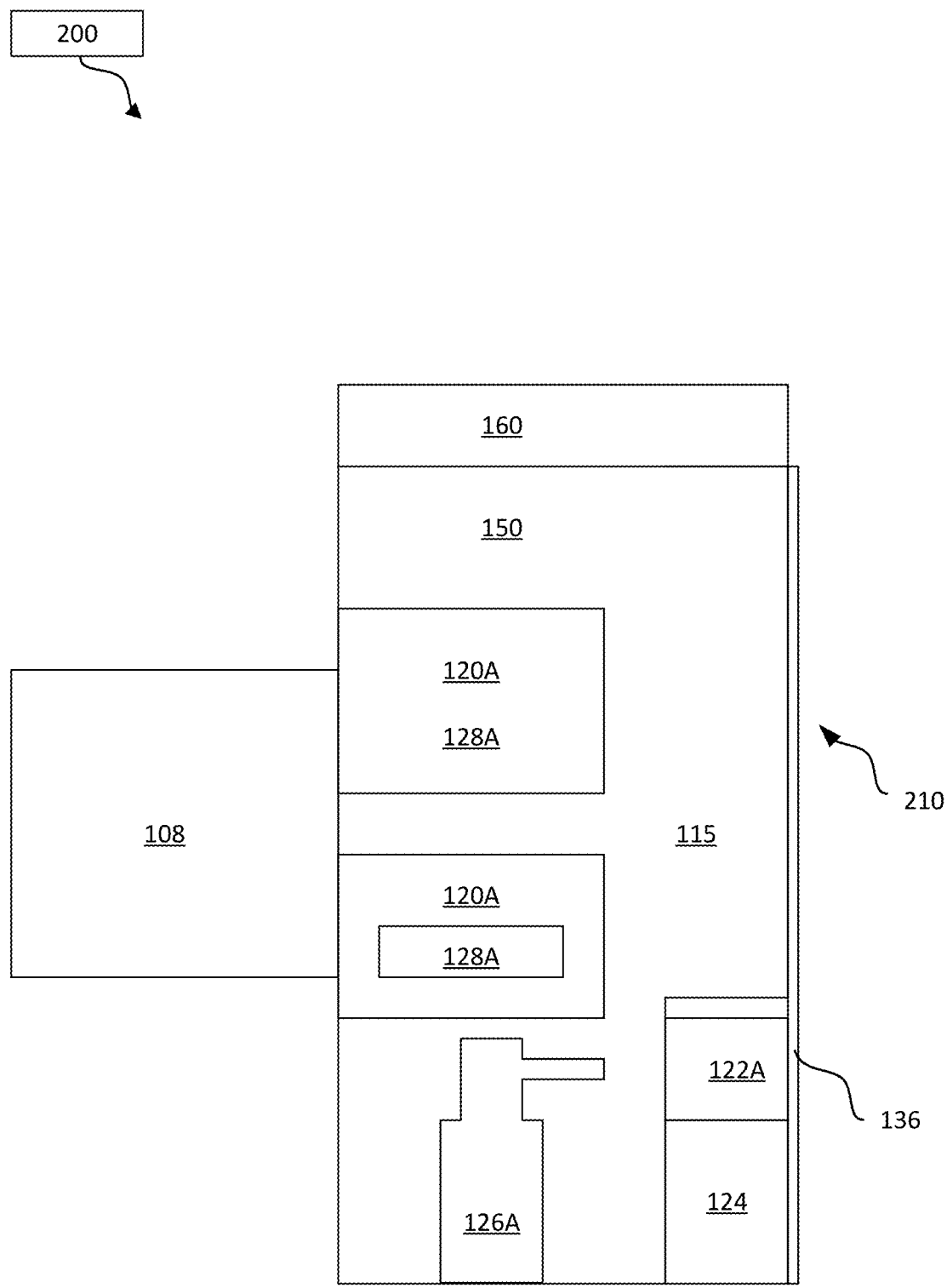
FIG. 2B is a side schematic view of another example electronic device manufacturing system, according to aspects of the present disclosure.
Figure 2C:
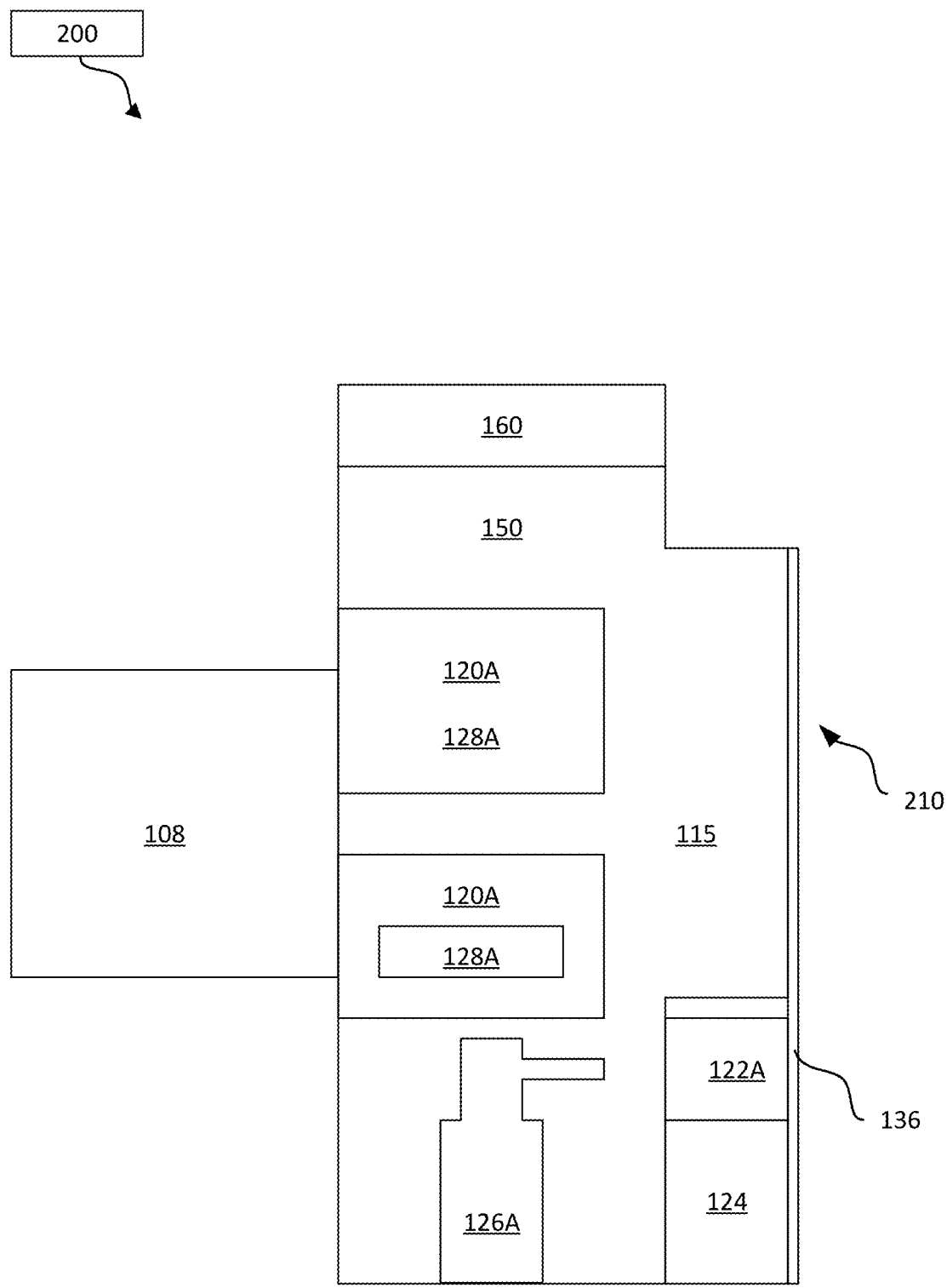
FIG. 2C is a side schematic view of a different example electronic device manufacturing system, according to aspects of the present disclosure.

FIG. 2A is a top schematic view of an electronic device manufacturing system 200 including process tool 204 and a factory interface 206 coupled to process tool 204, in accordance with one embodiment of the present disclosure. The components and functions of process tool 204 and factory interface 206 may be similar to process tool 104 and factory interface 206, respectively. FIGS. 2A-C describes an example electronic device manufacturing system 200 similar to that described with reference to FIGS. 1A-1D, but where factory interface 206 includes bulged section 210 at a front side of the factory interface 106. FIG. 2A is a top schematic view of the example electronic device manufacturing system 200, according to aspects of the present disclosure. FIG. 2B is a side schematic view of the example electronic device manufacturing system 200, according to aspects of the present disclosure. FIG. 2C is a side schematic view of a different example of electronic device manufacturing system 200, according to aspects of the present disclosure. Bulged section 210 can provide for additional space within factory interface 206. Bulged section 210 can extend any length away from load locks 120A-B, and can have a top section (e.g., a ceiling) with a height independent of the height of the remainder of factory interface 206, as shown in FIG. 2C. For example, the height of the top section of bulged section 210 can be one meter, two meters, the same height as the top section of factory interface 206 (as shown in FIG. 2B), a height taller than the top section of factory interface 206 (not shown), or some other height. In some embodiments, bulged section 210 may extend to the ends of the substrate carriers 122A-D to not increase the operational footprint of factory interface 206. Thus, in embodiments a front face of the bulged section 210 can be approximately flush with a front of carriers 122A-F. In some embodiments, bulged section 210 provides factory interface 206 with additional space for housing various components, such as, but not limited to, substrate storage containers, metrology equipment, servers, air conditioning units, etc. Bulged section 210 can share the clean environment of factory interface 206.

In some embodiments, factory interface robot 126A can be configured to transfer one or more substrate to factory interface robot 126B, or vice-versa, using a pass through area 115 disposed within bulged section 210. For example, factory interface robot 126A can hand-off the substrate(s) to factory interface robot 126B using the pass through area disposed within bulged section 210. In another example, factory interface robot 126A can place the substrate(s) on a shelf in the pass through area disposed within bulged section 210, and factory interface robot 126B can retrieve the substrate(s) from the shelf.

In some embodiments, the load locks are not included within the factory interface. In such embodiments, the factory interface may be split into two or more factory interfaces (e.g., a left and right factory interface). The load locks may then be positioned between the left and right factory interfaces. This may reduce the total combined footprint of the factory interface and the load locks in the same manner as the embodiments described above.

In a descriptive example, a front side of the factory interface 206 can include a center portion (e.g., bulged section 210), a left front portion, and a right front portion, where the center portion protrudes away from the left front portion, the right front portion, and the back side, where a first load port (e.g., one of load ports 122) is positioned at a first position on the front left portion, and a second load port (e.g., another one of load ports 122) is positioned at a second position on the right front portion. A via disposed within the interior volume of the factory interface 206 at the center portion can be used by a first factory interface robot (e.g., factory interface robot 126A) configured to transfer a substrate to a second factory interface robot (e.g., factory interface robot 126B) through the via.

Figure 3A:
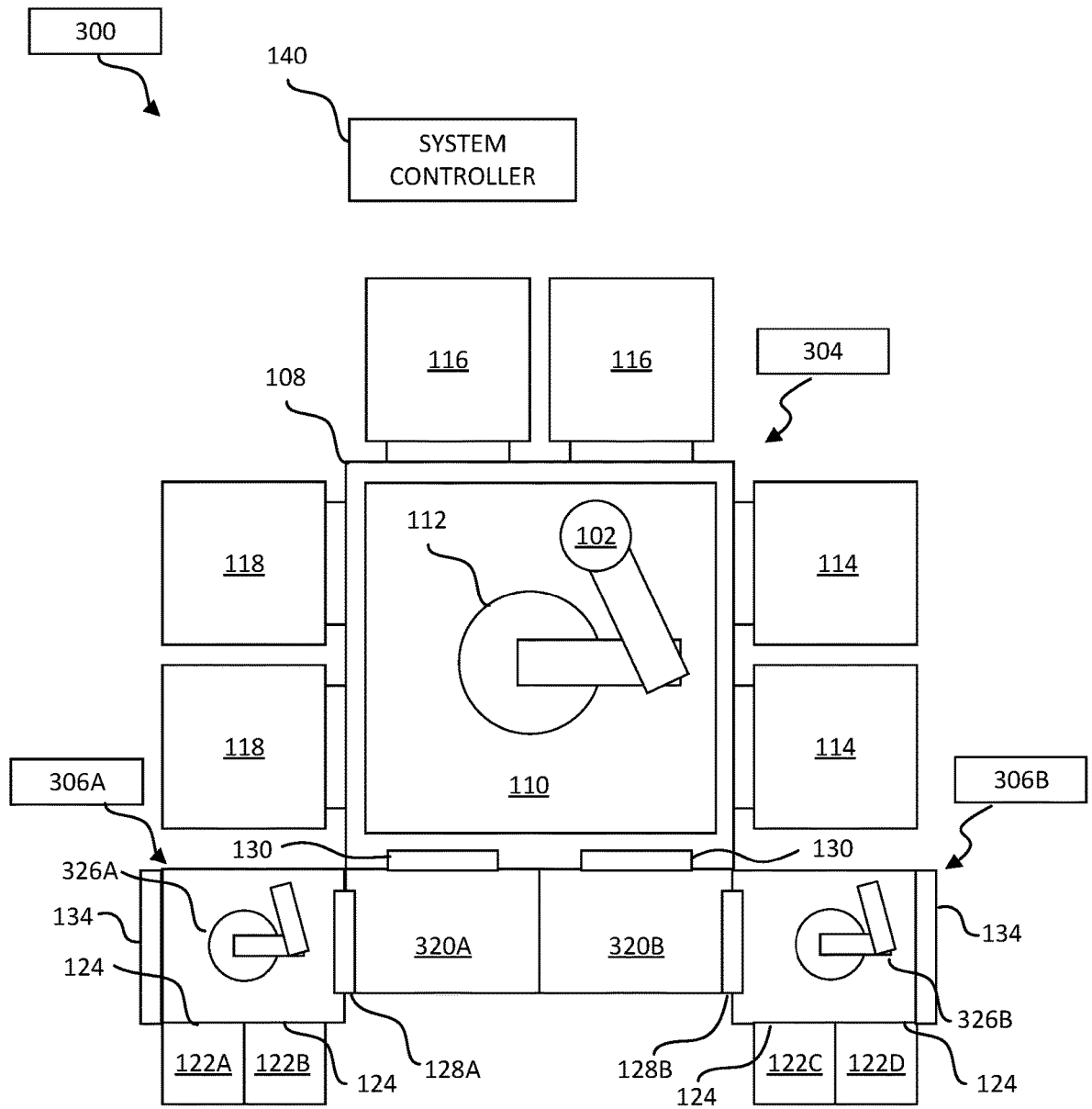
FIG. 3A is a top schematic view of yet another example electronic device manufacturing system, according to aspects of the present disclosure.
Figure 3B:
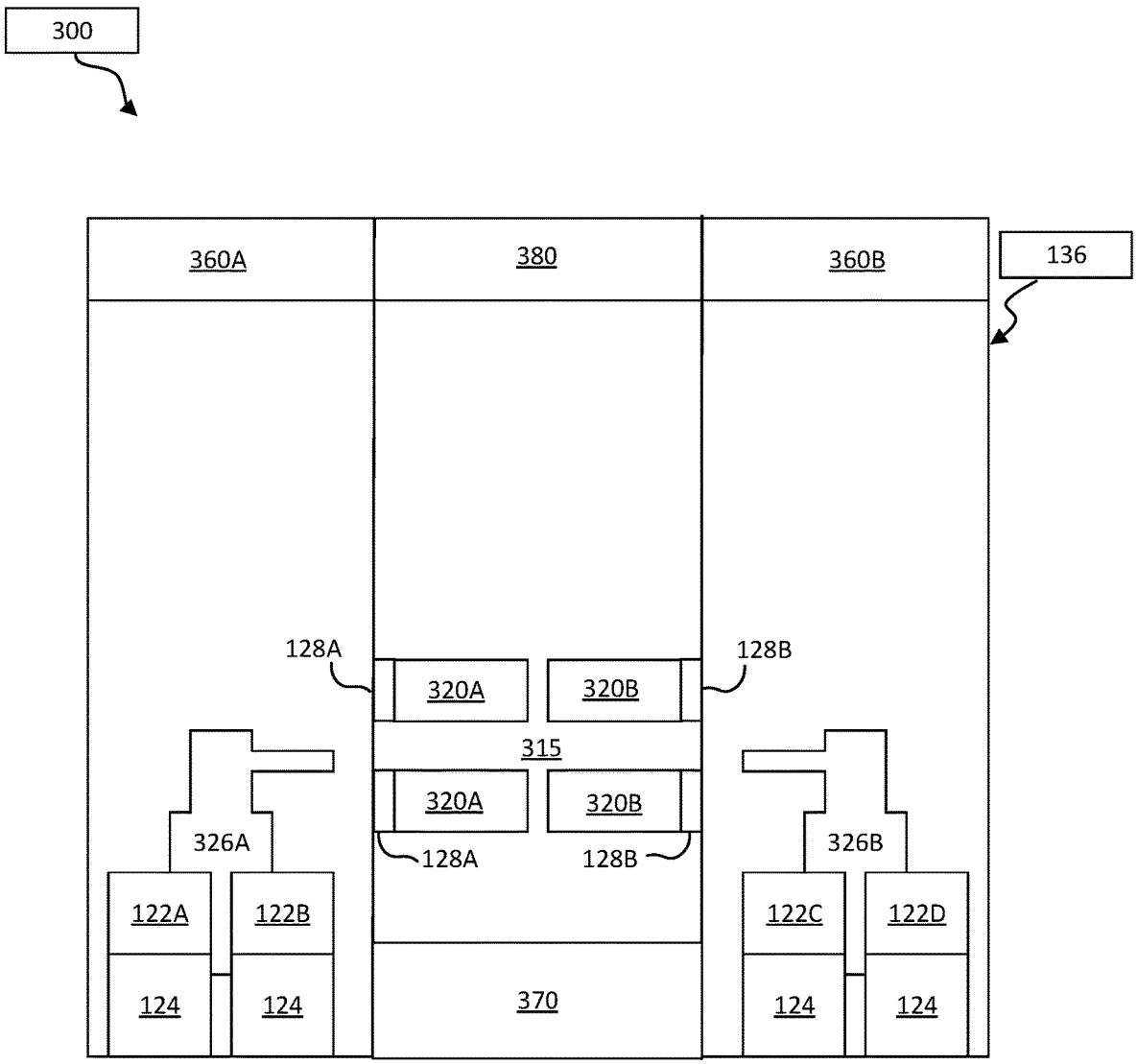
FIG. 3B is a front schematic view of the yet another example electronic device manufacturing system, according to aspects of the present disclosure.

FIGS. 3A-3B describe an electronic device manufacturing system 300 where a first load lock (e.g., load lock 120A) is connected to a first factory interface (e.g., factory interface 306A) and a second load lock (e.g., load lock 120B) is connected to a second factory interface (e.g., factory interface 306B). FIG. 3A is a top schematic view of example electronic device manufacturing system 300, according to aspects of the present disclosure. FIG. 3B is a front schematic view of example electronic device manufacturing system 300, according to aspects of the present disclosure.

Electronic device manufacturing system 300 includes a process tool 304, load locks 320A-B coupled to process tool 304, and factory interfaces 306A-B, where factory interface 306A is coupled to load lock 320A, and factory interface 306B is coupled to load lock 320B. The components and functions of process tool 304, load locks 320A-B, and factory interfaces 306A-B may be similar to process tool 104, load locks 120A-B, and factory interface 106, respectively.

Load locks 320A-B can be coupled to housing 108 and transfer chamber 110. Load locks 320A-B can be configured to interface with transfer chamber 110 and factory interfaces 306A-B. Load locks 320A-B can have an environmentally-controlled atmosphere that is changed from a vacuum environment (where substrates are transferred to and from transfer chamber 110) to an at or near atmospheric-pressure inert-gas environment (where substrates are transferred to and from factory interfaces 306A-B) in some embodiments. In some embodiments, load locks 320A-B are each a stacked load lock having a pair of upper interior chambers and a pair of lower interior chambers that are located at different vertical levels (e.g., one above another). In some embodiments load locks 320A-B are each a batch load lock. More or fewer load locks may be used than the number shown.

Similar to factory interface 106, each of factory interfaces 306A-B can be any suitable enclosure, such as, e.g., an Equipment Front End Module (EFEM). Factory interface 306A can be configured to receive substrates 102 from substrate carriers 122A-B docked at various load ports 124 of factory interface 306A. Note that while two substrate carriers 122A-B are shown, more or fewer substrate carriers may be connected to factory interface 306A. Factory interface 306B can be configured to receive substrates 102 from substrate carriers 122C-D docked at various load ports 124 of factory interface 306B. Note that while two substrate carriers 122C-D are shown, more or fewer substrate carriers may be connected to factory interface 306B. Load ports 124 and the attached substrate carriers can be located at different elevations along the walls of factory interface 106. Elevating the load ports 124 allows for placement of one or more auxiliary components (not shown) at the base of factory interfaces 106 and/or allows multiple substrate carriers to be stacked vertically.

Factory interface robots 326A-B can be similar to factory interface robots 126A-B, respectively, and can be configured to transfer substrates 102 between substrate carriers 122A-D and load locks 320A-B. For example, factory interface robot 326A can be configured to transfer substrates 102 between substrate carriers 122A-B and load lock 320A, and factory interface robot 326B can be configured to transfer substrates 102 between substrate carriers 122C-D and load lock 320B. In one embodiment, factory interface 306A includes one or more factory interface robots, and factory interface 306B includes one or more factory interface robots. For example, factory interface 306A may include a first factory interface robot 326A disposed within factory interface 306A and factory interface 306B may include a second factory interface robot 326B disposed within factory interface 306B. In one embodiment, the first and second load locks 320A, 320B are disposed between the first and second factory interface robots 326A, 326B, with load lock 320A being closer to factory interface robot 326A and load lock 320B being closer to factory interface robot 326B.

A first vacuum port (not shown) can couple factory interface 306A to load lock 320A and a second vacuum port can couple factory interface 306B to load lock 320B. The atmosphere of each load lock 320A-B can regulated independent of the other load lock 320A-B. This allows a factory operator to access one load lock and factory interface for maintenance or repair while the other load lock and factory interface remains operational.

Factory interface 106 can include one or more auxiliary components 150. The auxiliary components 150 can include substrate storage containers, metrology equipment, servers, air conditioning units, etc. A substrate storage container can store substrates and/or substrate carriers (e.g., FOUPs). Metrology equipment can be used to determine property data of the products that were produced by the electronic device manufacturing system 100.

In some embodiments, factory interface 306A can include upper compartment 360A, as seen in FIG. 3B, factory interface 306B can include upper compartment 360B, and load locks 320A-B may include middle compartment 380 and lower compartment 370. Each of these compartments can house one or more of electronic systems (e.g., servers, air conditioning units, etc.), utility cables, system controller 140, or other components.

As shown, in one embodiment side door 128A is approximately perpendicular to a back side of factory interface 306A, and is also approximately perpendicular to door 130. Similarly, in one embodiment side door 128B is approximately perpendicular to the back side of factory interface 306B, and is also approximately perpendicular to door 130. Side door 128A may face an opposite direction to side door 128B. Though not shown, one or more additional side doors may be included in load locks 320A-B, where the one or more additional side doors are between and separate the load locks 320A-B. For example, an additional side door of load lock 320B may be on an opposite side of side door 328B, and may be opened to permit factory interface robot 326B to place substrates in load lock 320A, to permit factory interface robot 326A to place substrates in load lock 320B, and/or to permit handoff of substrates between factory interface robot 326A and factory interface robot 326B.

In embodiments, factory interface robots 326A-B may orient end effectors in a first direction that is pointed towards and approximately perpendicular to a front side of the factory interface when retrieving substrates from and/or placing substrates in containers 122A-D. In embodiments, factory interface robot 326A may orient one or more end effectors in a second direction that may be approximately perpendicular to the first direction when retrieving substrates from and/or placing substrates in load lock 320A. Similarly, factory interface robot 326B may orient one or more end effectors in a third direction that may be approximately perpendicular to the first direction when retrieving substrates from and/or placing substrates in load lock 320B. Third direction may be approximately 180 degrees from the second direction in embodiments.

Load locks 320A-320B may be accessed without exposing the interior volume of the factory interfaces 306A-B to an external environment. In an embodiment, load locks 320A, 320B include additional access doors (not shown) that are on opposite sides of the load locks to doors 130. Such access doors may be opened while doors 130, 128A, 128B are closed to enable maintenance access to the load locks 320A-B without exposing the interior of the factory interfaces 306A-B to an external environment.

Referring now to FIG. 3B, in some embodiments, the factory interface robot 326A can be configured to transfer one or more substrate to factory interface robot 326B, or vice-versa, using a pass through area 315. In an example, the pass through area 315 can be a via between the pair of upper interior chambers and a pair of lower interior chambers of load locks 320A-B (e.g., where load locks 120A-B are each a stacked load lock). In some embodiments, the pass through area 315 may be a part of the environmentally-controlled atmosphere that is changed from a vacuum environment (where substrates are transferred to and from transfer chamber 110) to an at or near atmospheric-pressure inert-gas environment (where substrates are transferred to and from an interior volume of factory interface 106 that is external to the load locks). For example, the pass through area 315 may be part of an environmentally controlled area of one or more of the load locks, or may have its own separate environmentally controlled area. In one embodiment in which the pass through area 315 is between the upper interior chambers and the lower interior chambers, the pass through area is included within an enclosure containing the load locks, and includes slit valves that can be used to seal off the pass through area 315 from the environment of the factory interface. Alternatively, the pass through area 315 may be exposed to and/or part of an environment of the factory interface. Alternatively, or additionally, vias may be positioned above and/or below the load locks, and may provide pass through areas between the factory interfaces 306A-306B. In some embodiments, either or both of the vias positioned above and/or below the load locks may be a part of the environmentally-controlled atmosphere of one or more of the load locks. Factory interface robot 326A can be configured to transfer one or more substrates to the factory interface robot 326B through the any of the pass through areas, and vice versa. In some embodiments, factory interface robot 326A can hand-off the substrate(s) to factory interface robot 326B. In some embodiments, factory interface robot 326A can place the substrate(s) on a shelf in the pass through area, and factory interface robot 326B can retrieve the substrate(s) from the shelf.

In a descriptive example, electronic device manufacturing system 300 includes a transfer chamber 110, a plurality of processing chambers connected to the transfer chamber 114, 116, 118, a first load lock (e.g., load lock 320A) having a first side and a second side that is approximately perpendicular to the first side of the first load lock, where the first side of the first load lock is connected to the transfer chamber 110. Further, the electronic device manufacturing system 300 includes a second load lock (e.g., load lock 320B) having a first side and a second side that is approximately perpendicular to the first side of the second load lock, where the first side of the second load lock is connected to the transfer chamber 110. A first factory interface 306A is connected to the second side of the first load lock, and a second factory interface 306B is connected to the second side of the second load lock. The first factory interface 306A can include a first atmospheric environment and the second factory interface 306B can include a second atmospheric environment.

Figure 4:
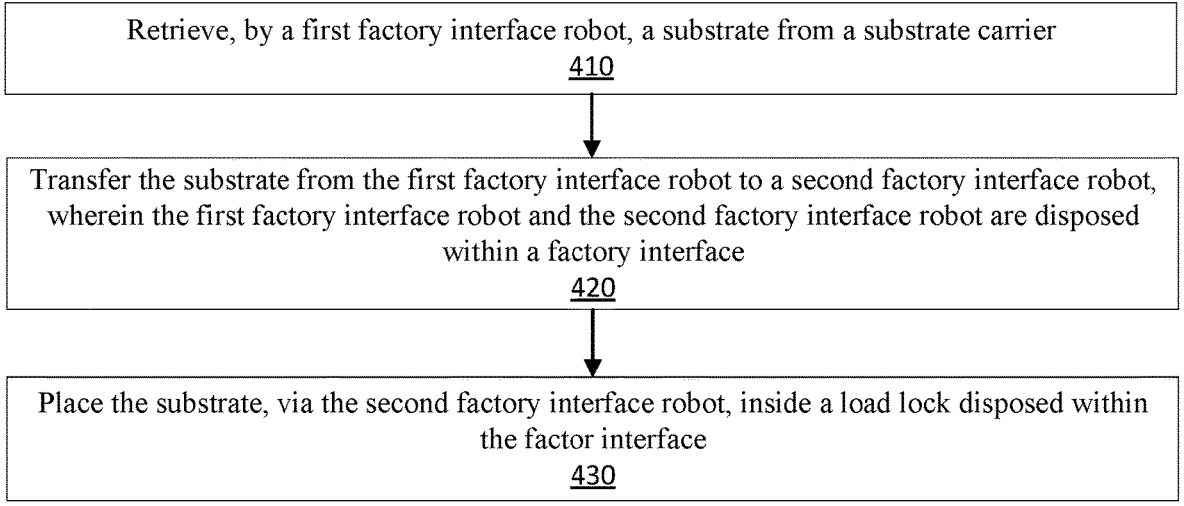
FIG. 4 is a method for transporting substrates from a first factory interface robot to a second factory interface robot, in accordance with embodiments of the present disclosure.

FIG. 4 is a method for transporting substrates from a first factory interface robot to a second factory interface robot, in accordance with embodiments of the present disclosure. At block 410, a first factory robot retrieves a substrate from a substrate carrier. In an example, the substrate carrier is a FOUP. At block 420, the first factory interface robot transfers the substrate to a second factory robot. In an example, the first factory robot and the second factory robot are disposed within a factory interface. In another example, the first factory robot is disposed in a first factory interface, and the second factory robot is disposed in a second factory interface. The first factory interface robot can be configured to transfer the substrate to the second factory interface robot using a pass through area. In a first example, the pass through area can be disposed between a front side of the factory interface and a front-facing side of a load lock. In a second example, the pass through area can be a via or open space disposed within the interior volume of the factory interface above one or more load locks. In a third example, the pass through area can be an open space or a via disposed between a pair of upper interior chambers and a pair of lower interior chambers of load locks (e.g., where the load locks are each a stacked load lock). In a fourth example, the pass through area can be an open space or a via disposed below one or more load locks. The first factory interface robot can be configured to transfer the substrate to the second factory interface robot through the pass through area.

At block 430, the second factory interface robot places the substrate inside a load lock disposed within the factory interface. The load lock cannot be access by the first factory interface robot. In an example, the second factory robot can retrieve a substrate from inside the load lock disposed within the factory interface. The second factory robot can then transfer the substrate to the first factory robot. The second factory interface robot can be configured to transfer the substrate to the first factory interface robot using the pass through area. The first factory robot can then place the substrate within the substrate carrier.

The preceding description sets forth numerous specific details such as examples of specific systems, components, methods, and so forth in order to provide a good understanding of several embodiments of the present disclosure. It will be apparent to one skilled in the art, however, that at least some embodiments of the present disclosure can be practiced without these specific details. In other instances, well-known components or methods are not described in detail or are presented in simple block diagram format in order to avoid unnecessarily obscuring the present disclosure. Thus, the specific details set forth are merely exemplary. Particular implementations can vary from these exemplary details and still be contemplated to be within the scope of the present disclosure.

Reference throughout this specification to "one embodiment" or "an embodiment" means that a particular feature, structure, or characteristic described in connection with the embodiment is included in at least one embodiment. Thus, the appearances of the phrase "in one embodiment" or "in an embodiment" in various places throughout this specification are not necessarily all referring to the same embodiment. In addition, the term "or" is intended to mean an inclusive "or" rather than an exclusive "or." When the term "about" or "approximately" is used herein, this is intended to mean that the nominal value presented is precise within ±10%.

Although the operations of the methods herein are shown and described in a particular order, the order of operations of each method can be altered so that certain operations can be performed in an inverse order so that certain operations can be performed, at least in part, concurrently with other operations. In another embodiment, instructions or sub-operations of distinct operations can be in an intermittent and/or alternating manner.

It is understood that the above description is intended to be illustrative, and not restrictive. Many other embodiments will be apparent to those of skill in the art upon reading and understanding the above description. The scope of the disclosure should, therefore, be determined with reference to the appended claims, along with the full scope of equivalents to which such claims are entitled.

What is claimed is:

1. A factory interface for an electronic device manufacturing system, the factory interface comprising:
an interior volume defined by a bottom, a top and a plurality of sides, wherein the plurality of sides comprise a back side that is configured to face a transfer chamber of the electronic device manufacturing system and a front side comprising one or more first load ports and one or more second load ports for receiving substrate carriers, wherein the front side comprises a bulged section, between the one or more first load ports and the one or more second load ports, that protrudes away from the front side and provides additional space within the factory interface;
the load lock integrated into the interior volume of the factory interface such that the load lock is disposed entirely within the interior volume of the factory interface, wherein the load lock comprises a first door that is approximately perpendicular to the back side, and a second door that is approximately parallel to the back side and accessible by a transfer chamber robot, wherein the back side of the factory interface is approximately flush with the second door; and a factory interface robot disposed within the interior volume of the factory interface, wherein the factory interface robot is configured to transfer substrates between a set of substrate carriers and the load lock.

2. The factory interface of claim 1, further comprising:
a second load lock disposed within the interior volume of the factory interface; and
a second factory interface robot configured to transfer substrates between a second set of substrate carriers and the second load lock.

3. The factory interface of claim 2, wherein the plurality of sides comprise a right side and a left side, wherein the factory interface robot is disposed within the interior volume proximate to the left side, wherein the second factory interface robot is disposed within the interior volume proximate to the right side, and wherein the load lock and the second load lock are disposed adjacent to the back side and between the factory interface robot and the second factory interface robot such that the load lock is nearer to the factory interface robot than the second load lock and the second load lock is nearer to the second factory interface robot than the load lock.

4. The factory interface of claim 3, further comprising:
a first set of load ports for receiving the set of substrate carriers, wherein the first set of load ports are positioned at a first portion of the front side that is proximate to the left side; and
a second set of load ports for receiving the second set of substrate carriers, wherein the second set of load ports are positioned at a second portion of the front side that is proximate to the right side.

5. The factory interface of claim 4, further comprising:
at least one of a substrate storage container or metrology equipment positioned below a load port of the first set of load ports.

6. The factory interface of claim 2, further comprising:
a via disposed within the interior volume of the factory interface above or below the load lock, wherein the factory interface robot is configured to transfer a substrate to the second factory interface robot through the via.

7. The factory interface of claim 1, wherein the plurality of sides comprise a right side and a left side, wherein the factory interface robot is disposed within the interior volume proximate to the left side, wherein the load lock is disposed adjacent to the back side and between the factory interface robot and the right side.

8. The factory interface of claim 1, wherein the load lock is a batch load lock.

9. The factory interface of claim 1, further comprising:
a second load lock disposed within the interior volume of the factory interface and below the load lock.

10. The factory interface of claim 1, wherein the front comprises a center portion, a left front portion, and a right front portion, wherein the center portion protrudes away from the left front portion, the right front portion, and the back side, wherein a first load port for receiving a first substrate carrier from the set of substrate carriers is positioned at a first position on the front left portion, and a second load port for receiving a second substrate carrier from the set of substrate carries is positioned at a second position on the right front portion.

11. The factory interface of claim 10, further comprising:
a via disposed within the interior volume of the factory interface at the center portion that protrudes away from the left front portion, the right front portion, and the back side, wherein the factory interface robot is configured to transfer a substrate to a second factory interface robot through the via.

12. The factory interface of claim 1, wherein the bulged section comprises an access door for performing maintenance on the load lock, wherein the access door is of a same height as a top section of the bulged section.

13. The factory interface of claim 1, wherein the bulged section comprises a top section having a height independent of a top section of the factory interface.

14. An electronic device manufacturing system, comprising:
a transfer chamber;
a plurality of processing chambers connected to the transfer chamber;
a load lock having a first side and a second side that is approximately perpendicular to the first side of the load lock, wherein the first side of the load lock is connected to the transfer chamber, wherein the load lock comprises a first door that is approximately parallel to the first side and accessible by a transfer chamber robot, and a second door that is approximately parallel to the second side;
a factory interface connected to the first side of the load lock, wherein the load lock is integrated into an interior volume of the factor interface such that the load lock is disposed entirely within the interior volume of the factor interface, wherein the first side of the load lock is approximately flush with a backside of the factory interface, wherein a front side of the factory interface comprises a bulged section that protrudes away from the front side to provides additional space within the factory interface; and
a factory interface robot disposed within the interior volume of the factory interface, wherein the factory interface robot is configured to transfer substrates between a set of substrate carriers and the load lock.

15. The electronic device manufacturing system of claim 14, further comprising:
a second load lock having a third side and a fourth side that is approximately perpendicular to the third side of the second load lock, wherein the third side of the second load lock is connected to the transfer chamber, wherein the second load lock comprises a third door that is approximately parallel to the third side and accessible by the transfer chamber robot;
a second factory interface connected to the fourth side of the second load lock; and
a second factory interface robot disposed within the interior volume of the second factory interface, wherein the second factory interface robot is configured to transfer substrates between a second set of substrate carriers and second first load lock.

16. The electronic device manufacturing system of claim 15, wherein the factory interface comprises an atmospheric environment and the second factory interface comprises a second atmospheric environment.

17. The electronic device manufacturing system of claim 15, wherein the load lock and the second load lock are each a stacked load lock having a pair of upper interior chambers and a pair of lower interior chambers that are located at different vertical levels, wherein the electronic device manufacturing system further comprises:
a via disposed within between the pairs of upper interior chambers and the pairs of lower interior chambers, wherein the factory interface robot is configured to transfer a substrate to the second factory interface robot through the via.

18. The electronic device manufacturing system of claim 14, wherein the factory interface comprises a set of load ports for receiving the set of substrate carriers.

19. A method for transporting substrates, comprising:
retrieving, by a factory interface robot, a substrate from a substrate carrier; and
placing the substrate, via the factory interface robot, inside a load lock disposed entirely within an interior volume of a factory interface, wherein the load lock comprises a first door that is approximately perpendicular to a back side of the factory interface, and a second door that is approximately parallel to the back side and accessible by a transfer chamber robot, wherein the back side is configured to face a transfer chamber and is approximately flush with the second door, wherein the factory interface comprise a front side comprising one or more load ports, wherein the front side comprises a bulged section, between a first load port and a second load port of the one or more load ports, that protrudes away from the front side and provides additional space within the factory interface.

20. The method of claim 19, further comprising:
retrieving, by the factory interface robot, a second substrate from a substrate carrier;
transferring the second substrate from the factory interface robot to a second factory interface robot, wherein the factory interface robot and the second factory interface robot are disposed within the factory interface; and
placing the substrate, via the second factory interface robot, inside a second load lock disposed within the factory interface.

21. The method of claim 20, wherein the factory interface robot cannot access the second load lock.

22. The method of claim 20, wherein the substrate is transferred through a via disposed within an interior volume of the factory interface above or below the second load lock.

* * * * *